United States Patent
Kikuchi et al.

(10) Patent No.: US 7,642,635 B2
(45) Date of Patent: Jan. 5, 2010

(54) STACKED SEMICONDUCTOR PACKAGE

(75) Inventors: Wataru Kikuchi, Tokyo (JP); Toshio Sugano, Tokyo (KP); Satoshi Isa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 71 days.

(21) Appl. No.: 11/531,167

(22) Filed: Sep. 12, 2006

(65) Prior Publication Data

US 2007/0001299 A1    Jan. 4, 2007

Related U.S. Application Data

(62) Division of application No. 10/787,127, filed on Feb. 27, 2004, now abandoned.

(30) Foreign Application Priority Data

Feb. 28, 2003  (JP)  ............................. 2003-53260
Feb. 25, 2004  (JP)  ............................. 2004-50264

(51) Int. Cl.
    *H01L 23/02*  (2006.01)
(52) U.S. Cl. ............................. 257/686; 257/E23.085; 257/734; 257/773; 257/780; 257/786
(58) Field of Classification Search ................ 257/686, 257/697, 734, 737, 738, 773, 777, 778, 780, 257/786, E23.085
See application file for complete search history.

(56) References Cited

U.S. PATENT DOCUMENTS

| | | |
|---|---|---|
| 5,375,041 A | 12/1994 | McMahon |
| 5,616,954 A | 4/1997 | Tobase |
| 5,717,245 A | 2/1998 | Pedder |
| 6,072,699 A | 6/2000 | Horine |
| 6,433,422 B1 | 8/2002 | Yamasaki |
| 6,462,421 B1 | 10/2002 | Hsu et al. |
| 6,473,308 B2 | 10/2002 | Forthun |
| 6,670,700 B1 | 12/2003 | Hashimoto |
| 2001/0040793 A1 | 11/2001 | Inaba |

(Continued)

FOREIGN PATENT DOCUMENTS

JP    9-199665 A    7/1997

(Continued)

OTHER PUBLICATIONS

Kweon et al., Dual Chip Memory Package, IEEE/CPMT International, pp. 127-132.*

*Primary Examiner*—Monica Lewis
(74) *Attorney, Agent, or Firm*—Sughrue Mion, PLLC

(57) ABSTRACT

A stacked semiconductor package comprises two semiconductor chips (11, 12) each of which has a mounting surface provided with a plurality of chip pins arranged in a predetermined pattern. The semiconductor chips are mounted on opposite surfaces of a substrate (13) so that the mounting surfaces are faced to each other through the substrate. The substrate is provided with a plurality of package pins formed in an area other than a chip mounting area and arranged in a pattern identical to the predetermined pattern. A pair of the corresponding chip pins of the semiconductor chips are connected to a via formed at an intermediate position therebetween by the use of branch wires equal in length to each other. The via is connected by a common wire to the package pin corresponding to the chip pins connected to the via.

13 Claims, 19 Drawing Sheets

U.S. PATENT DOCUMENTS

| | | |
|---|---|---|
| 2002/0030975 A1 | 3/2002 | Moon |
| 2003/0080438 A1 | 5/2003 | Matsuura et al. |

FOREIGN PATENT DOCUMENTS

| | | |
|---|---|---|
| JP | H11-135562 A | 5/1999 |
| JP | H11-186449 A | 7/1999 |
| JP | H11-220088 A | 8/1999 |
| JP | 2000-307037 A | 11/2000 |
| JP | 2001-217388 A | 8/2001 |
| JP | 2001-250909 A | 9/2001 |
| JP | 2001-332681 A | 11/2001 |
| JP | 2001-332683 A | 11/2001 |
| JP | 2001-358285 | * 12/2001 |
| JP | 2001-358285 A | 12/2001 |
| JP | 2002-261192 A | 9/2002 |
| JP | 2003-298005 A | 10/2003 |
| WO | WO 01/15231 A1 | 3/2001 |
| WO | WO 01/026155 A1 | 4/2001 |

\* cited by examiner

RELATED ART

RELATED ART

RELATED ART

|   | 1 | 2 | 3 |   | 7 | 8 | 9 |
|---|---|---|---|---|---|---|---|
|   | VDD | NC | VSS | A | VSSQ | $\overline{DQS}$ | VDDQ |
|   | NC | VSSQ | DM | B | DQS | VSSQ | NC |
|   | VDDQ | DQ1 | VDDQ | C | VDDQ | DQ0 | VDDQ |
|   | NC | VSSQ | DQ3 | D | DQ2 | VSSQ | NC |
|   | VDDL | VREF | VSS | E | VSSDL | CK | VDD |
|   |   | CKE | $\overline{WE}$ | F | $\overline{RAS}$ | $\overline{CK}$ | OTD |
|   | BA2 | BA0 | BA1 | G | $\overline{CAS}$ | $\overline{CS}$ |   |
|   |   | A10 | A1 | H | A2 | A0 | VDD |
|   | VSS | A3 | A5 | J | A6 | A4 |   |
|   |   | A7 | A9 | K | A11 | A8 | VSS |
|   | VDD | A12 | A14 | L | A15 | A13 |   |

FIG. 9

| | 1 | 2 | 3 | | 7 | 8 | 9 |
|---|---|---|---|---|---|---|---|
| A | VDD | NC | VSS | | VSSQ | $\overline{DQS}$ | VDDQ |
| B | NC | VSSQ | DM | | DQS | VSSQ | NC |
| C | VDDQ | DQ1 | VDDQ | | VDDQ | DQ0 | VDDQ |
| D | NC | VSSQ | DQ3 | | DQ2 | VSSQ | NC |
| E | VDDL | VREF | VSS | | VSSDL | CK | VDD |
| F | | CKE0 | $\overline{WE}$ | | $\overline{RAS}$ | $\overline{CK}$ | ODT0 |
| G | BA2 | BA0 | BA1 | | $\overline{CAS}$ | $\overline{CS0}$ | $\overline{CS1}$ |
| H | CKE1 | A10 | A1 | | A2 | A0 | VDD |
| J | VSS | A3 | A5 | | A6 | A4 | ODT1 |
| K | | A7 | A9 | | A11 | A8 | VSS |
| L | VDD | A12 | A14 | | A15 | A13 | |

FIG. 10

STACKED SEMICONDUCTOR PACKAGE

This is a divisional of Application Ser. No. 10/787,127, filed Feb. 27, 2004, which claims priority of prior Japanese applications JP 2003-53260 and 2004-50264. The entire disclosures of the prior applications are hereby incorporated by reference.

BACKGROUND OF THE INVENTION

This invention relates to a stacked semiconductor package and, in particular, to a stacked DRAM package allowing high-speed data transfer.

Referring to FIG. 1, a conventional stacked semiconductor package comprises stackable semiconductor packages. Each of the stackable semiconductor package comprises a substrate 102 provided with a cavity 101 formed on a center portion of a top surface thereof, a wiring pattern 103 extending from the top surface to a bottom surface of the substrate 102, a semiconductor chip 104 disposed in the cavity 101 of the substrate 102, a plurality of bonding wires 105 connecting the semiconductor chip 104 to the wiring pattern 103, and a plurality of terminal pads 106 formed on the top surface of the substrate 102 and connected to the wiring pattern 103, and a plurality of solder balls 107 formed on the bottom surface of the substrate 102 to be connected and fixed to the wiring pattern 103.

The terminal pads 106 are arranged in a pattern identical to that of the solder balls 107. In other words, the terminal pads 106 and the solder balls 107 are arranged so that, if a plurality of such stackable semiconductor packages are prepared and stacked on one another, the solder balls 107 of an upper package are faced in one-to-one correspondence to the terminal pads 106 of a lower package adjacent thereto. Therefore, by stacking a plurality of stackable semiconductor packages and carrying out a reflowing process, it is possible to obtain the stacked package in which a plurality of semiconductor chips are stacked and connected to one another (for example, see Japanese Patent Application Publication (JP-A) No. H11-220088).

Referring to FIG. 2, another conventional stacked semiconductor package comprises semiconductor chips 111 and flexible substrates 112 wrapping the semiconductor chips 111 separately.

Referring to FIG. 3, each of the semiconductor chips 111 of the stacked semiconductor package illustrated in FIG. 2 has a bottom surface provided with a plurality of contacts 121. On the other hand, each of the flexible substrate 112 has a top surface provided with a first conductive pad array 122 arranged in a pattern (reversed pattern) corresponding to that of the contacts 121. The flexible substrate 112 has a bottom surface provided with a second conductive pad array overlapping and aligned with the first conductive pad array 122 in a vertical direction (i.e., arranged in a pattern identical to that of the contacts 121), and third and fourth conductive pad arrays formed on opposite sides of the second conductive pad array. Each of the third and the fourth conductive pad arrays is arranged in a reversed pattern with respect to a corresponding half of the second conductive pad array and is connected to the corresponding half of the second conductive pad array through a wiring pattern.

When the semiconductor chip 111 is mounted on the top surface of the flexible substrate 112, the contacts 121 of the semiconductor chip 111 are connected to first conductive pads of the first conductive pad array 122 on the top surface of the flexible substrate 112 and, through the flexible substrate 112, are also connected to second conductive pads of the second conductive pad array located on the bottom surface of the flexible substrate 112. As a consequence, each of the contacts 121 of the semiconductor chip 111 is connected to a corresponding one of the pads contained in the third or the fourth conductive pad array. When the flexible substrate 112 is folded so as to wrap the semiconductor chip 111, the third and the fourth conductive pad arrays are positioned above a top surface of the semiconductor chip. That is, the third and the fourth conductive pad arrays face up. A fifth conductive pad array defined by the third and the fourth conductive pad arrays is arranged in a pattern identical to that of the first conductive pad array. Thus, the semiconductor chip 111 and the corresponding flexible substrate 112 form a stackable semiconductor package.

By stacking a plurality of stackable semiconductor packages having the above-mentioned structure and heating the packages stacked on one another, the second conductive pad array of an upper package and the fifth conductive pad array of a lower package adjacent thereto are connected by soldering to each other. As a result, the stacked package comprising the semiconductor packages stacked on one another and connected to one another is obtained as illustrated in FIG. 2 (for example, see U.S. Pat. No. 6,473,308).

Each of the conventional stacked semiconductor packages described above comprises stackable semiconductor packages each of which comprises the single substrate and the single semiconductor chip mounted thereto. That is, by stacking the stackable semiconductor packages, the stacked semiconductor package is obtained. In the stacked package, pins (solder balls or conductive pads) of the lowermost stackable semiconductor package are used as external connection terminals (stacked package pins) while pins of each of the remaining stackable semiconductor packages are used for connection to a lower adjacent one of the stackable semiconductor packages. Therefore, a wiring distance between the pins of each of the stackable semiconductor packages forming the stacked package and the external connection terminals depends upon a stacked position of each stackable semiconductor package in a vertical direction. Specifically, an upper package has a longer wiring distance and a lower package has a shorter wiring distance. Thus, the conventional stacked semiconductor packages are disadvantageous in that the distance to the external connection terminals is different depending upon the stacked position of each stackable semiconductor package.

SUMMARY OF THE INVENTION

It is an object of this invention to provide a stacked semiconductor package which comprises a single substrate and two semiconductor chips mounted thereto and which enables wiring lengths from an external connection terminal to the semiconductor chips to be substantially equal to each other.

It is another object of this invention to provide a stacked semiconductor package which allows high-speed data transfer.

According to this invention, there is provided a stacked semiconductor package comprising a substrate having first and second surfaces opposite to each other, and first and second semiconductor chips each of which has a mounting surface provided with a plurality of chip pins arranged in a predetermined pattern, the first and the second semiconductor chips being mounted on the first and the second surfaces of the substrate, respectively, so that the mounting surfaces are faced to each other with the substrate interposed therebetween.

In the above-mentioned stacked semiconductor package, the substrate has a plurality of package pins corresponding to the chip pins, respectively, and formed on the first or the second surface in an area different from a chip mounting area where the first or the second semiconductor chip is mounted.

The package pins may be arranged in a pattern identical to the predetermined pattern.

The package pins include an option pin connected to a corresponding chip pin of either one of the first and the second semiconductor chips and a regular pin connected to a corresponding chip pin of each of the first and the second semiconductor chips.

The substrate has a common wire having one end connected to the regular pin, and a branch wire portion connecting the other end of the common wire to two chip pins as the corresponding chip pins of the first and the second semiconductor chips. The wiring length from the one end of the common wire to either one of the corresponding chip pins is substantially equal to that from the one end of the common wire to the other of the corresponding chip pins.

In order to make the wiring length from the one end of the common wire to either one of the corresponding chip pins be substantially equal to that from the one end of the common wire to the other of the corresponding chip pins, the branch wire portion comprises a via formed in the vicinity of an intermediate position between the two chip pins and connected to the other end of the common wire, and first and second branch wires which are substantially equal to each other in length and which connect the via to the two chip pins.

In case where the two chip pins corresponding to the regular pin are faced to each other through the substrate, the branch wire portion has a via directly connecting the two chip pins.

The substrate is a multilayer substrate having a ground plane and/or a power supply plane. The common wire and the branch wire portion each forming a transmission line together with the ground plane and/or the power supply plane.

The semiconductor chip may be an elemental chip (bare die), such as a DRAM, produced by a wafer process (pre-process) or may have a packaged structure comprising a substrate and the elemental chip mounted on the substrate and electrically connected to the substrate.

BRIEF DESCRIPTION OF THE DRAWINGS

FIG. 9 is a view showing an arrangement of pins of the semiconductor chip illustrated in FIG. 8;

FIG. 10 is a view showing an arrangement of package pins of the stackable semiconductor package illustrated in FIGS. 4A and 4B;

DESCRIPTION OF THE PREFERRED EMBODIMENT

Now, a preferred embodiment of this invention will be described in detail with reference to the drawings.

Figure 1:
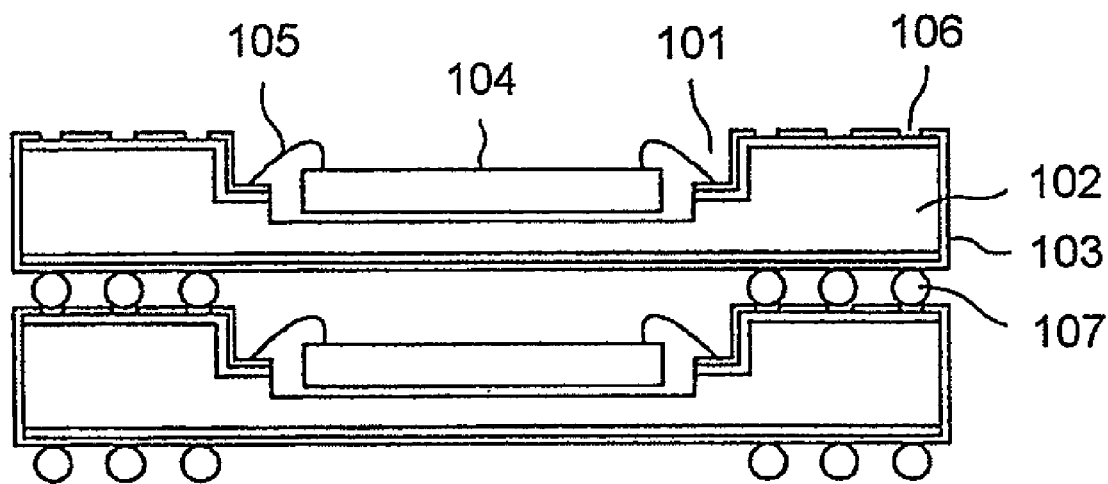
FIG. 1 is a sectional view of a conventional stacked semiconductor package.
Figures 2, 3:
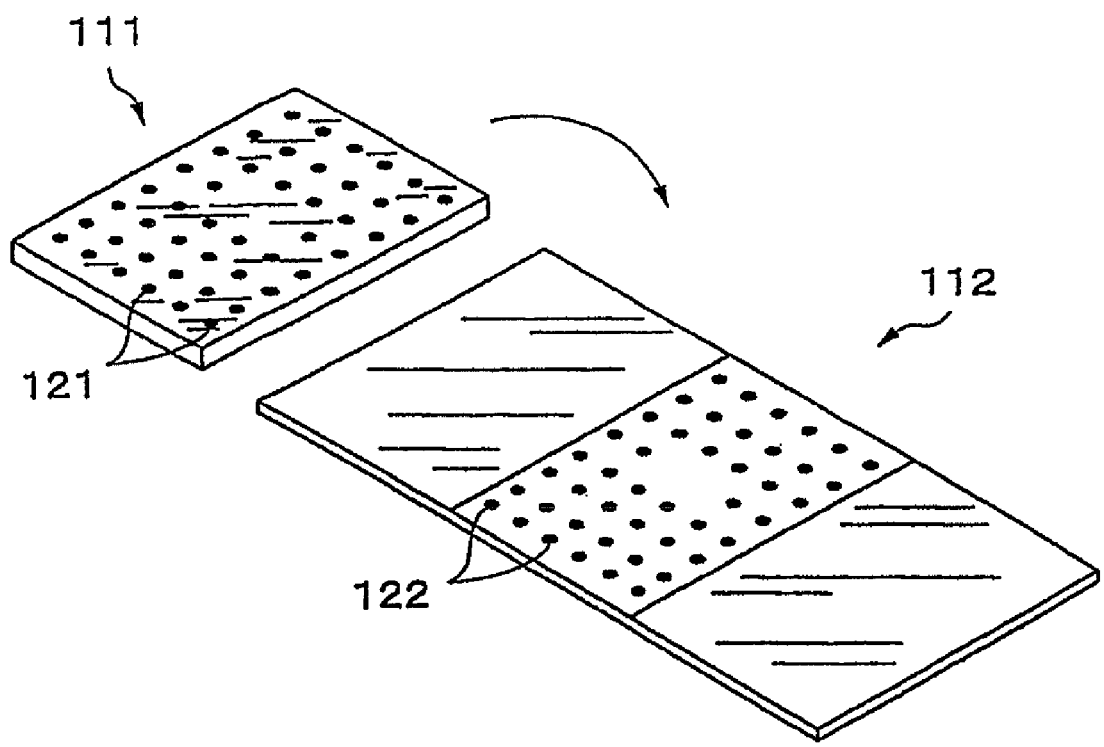
FIG. 2 is a perspective view of another conventional stacked semiconductor package.
FIG. 3 is an exploded perspective view for describing a semiconductor chip and a flexible substrate used in the stacked semiconductor package illustrated in FIG. 2.
Figure 4A:
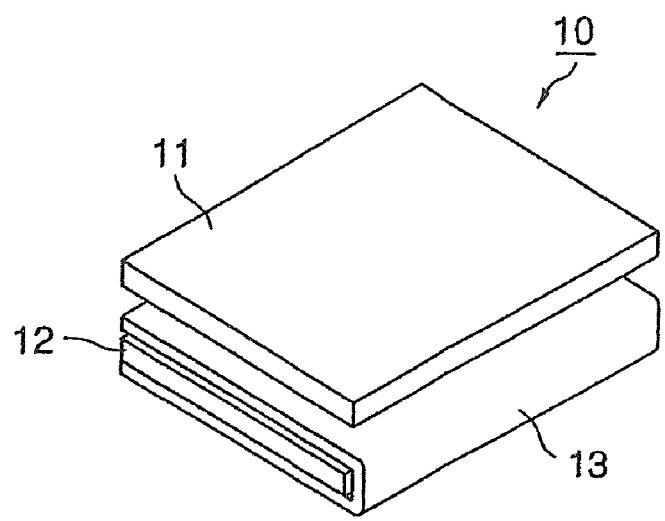
FIGS. 4A and 4B are a perspective view and a front view of a stacked semiconductor package according to one embodiment of this invention, respectively.
Figure 4B:
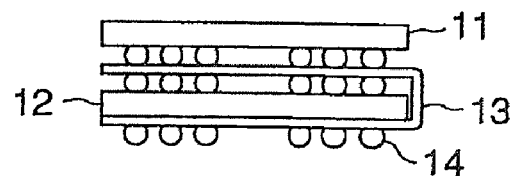

Referring to FIGS. 4A and 4B, a stacked semiconductor package 10 according to one embodiment of this invention comprises a first semiconductor chip 11, a second semiconductor chip 12, and a flexible substrate 13 on which the first and the second semiconductor chips 11 and 12 are mounted. The flexible substrate 13 has top and bottom surfaces as first and second surfaces opposite to each other.

The first semiconductor chip 11 is mounted on the top surface of the flexible substrate 13 in a chip mounting area (51 in FIG. 11) as one of two areas defined by dividing the top surface into two halves. The second semiconductor chip 12 is mounted on the bottom surface of the flexible substrate 13 to face the first semiconductor chip 11 with the flexible substrate 13 interposed therebetween. The first and the second semiconductor chips 11 and 12 are mounted to the flexible substrate 13, for example, by the use of solder balls.

The flexible substrate 13 is folded into two so as to wrap the second semiconductor chip 12. As a result of folding, the remaining area (52 in FIG. 11) of the top surface of the flexible substrate 13 becomes a bottom surface of the stacked semiconductor package 10 as a whole. In the remaining area, a plurality of package pins (solder balls) 14 are formed to serve as external connection terminals of the stacked semiconductor package 10.

Next referring to FIGS. 5 through 11, each of the first and the second semiconductor chips 11 and 12 and the flexible substrate 13 will be described in detail.

The first and the second semiconductor chips 11 and 12 are similar in structure to each other. Each of the first and the second semiconductor chips 11 and 12 may be a memory chip such as a DRAM. Furthermore, each of the first and the second semiconductor chips 11 and 12 may be an elemental chip (or a bare die) formed by a wafer process (pre-process) or may have a packaged structure comprising a substrate and the above-mentioned elemental chip mounted on the substrate by a packaging process (post-process).

Figure 5:
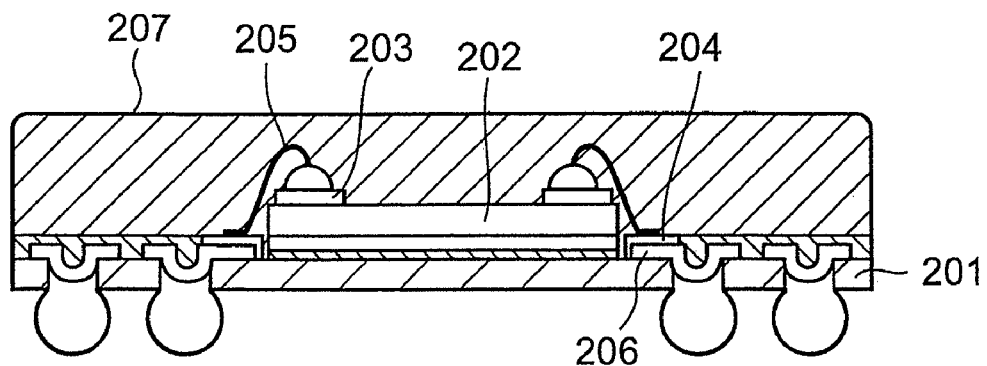
FIG. 5 is a sectional view of a semiconductor chip having a conventional package structure.
Figure 6:
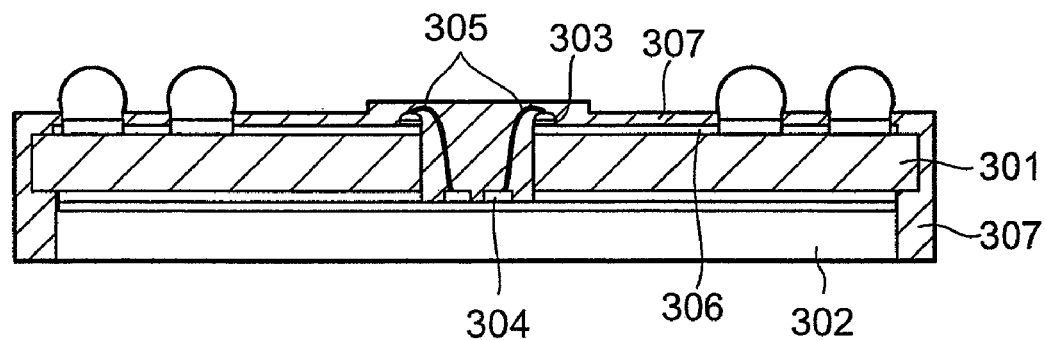
FIG. 6 is a sectional view of a semiconductor chip having another conventional package structure.

A semiconductor chip with the packaged structure, for example, is disclosed in Japanese Patent Application Publication (JP-A) No. H11-135562 and is also disclosed in Japanese Patent Application Publication (JP-A) No. H11-186449. The semiconductor chip has structure as illustrated in FIG. 5 or 6. In FIG. 5 or 6, the semiconductor chip is manufactured by mounting an elemental chip 202 or 302 on a substrate 201 or 301, electrically connecting wires (pads) 203 or 303 of the elemental chip 202 or 302 to wires 205 or 305 on the substrate by means of wire bonding (or inner lead bonding, flip-chip connection, and so on), and encapsulating the elemental chip 202 or 302 and the substrate in a resin mold 207 or 307 to protect a conductive pattern on the substrate. Wires 205 or 305 on the substrate connect to wiring pattern 204 or 304 to connect the elemental chip to terminal pads 206 or 306, which are provided with solder balls and serve as external connections.

Figure 7:
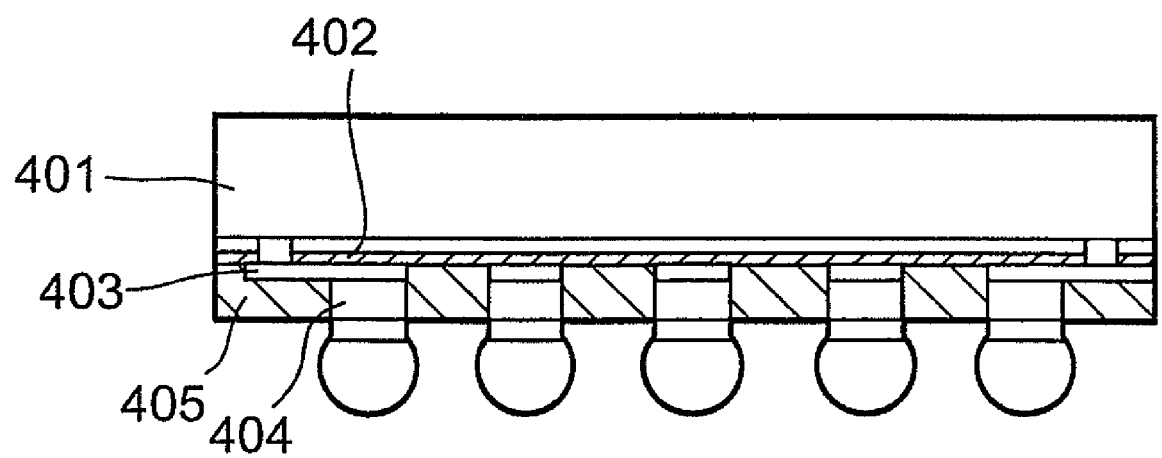
FIG. 7 is a sectional view of a semiconductor chip having still another conventional package structure.

Alternatively, there is a semiconductor chip with another packaged structure obtained according to a method in which a packaging process (post-process) is integrated with the wafer process (pre-process) and the packaging process is completed at a wafer level. The semiconductor chip is referred to as a wafer level CSP (Chip Size Package or Chip Scale Package) or a wafer process package. For example, the semiconductor chip of the type is disclosed in Japanese Patent Application Publication (JP-A) No. 2002-261192 and is also disclosed in Japanese Patent Application Publication (JP-A) No. 2003-298005. As illustrated in FIG. 7, the semiconductor chip disclosed in the former document is structured by forming a protection film 402, a rewiring layer 403, a copper post 404 and the like on a semiconductor substrate 401 which undergo a wafer process, and encapsulating them in a resin mold 405.

Figure 8:
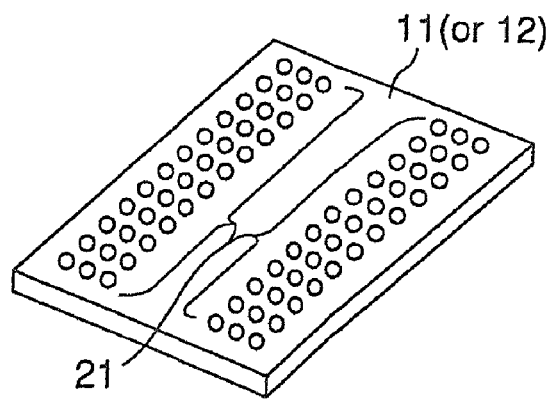
FIG. 8 is a perspective view of a semiconductor chip used in the stacked semiconductor package illustrated in FIGS. 4A and 4B.

As illustrated in FIG. 8, each of the semiconductor chips 11 and 12 has one surface (mounting surface) provided with a plurality of pins (semiconductor balls, may be called chip pins) 21 arranged in a predetermined pattern and adapted to be electrically and mechanically connected to the flexible substrate 13.

Each of the chip pins 21 is assigned with a specific role (signal). For example, in case of a SDRAM for DDR-II, the chip pins 21 are arranged in a matrix pattern and assigned with various roles as illustrated in FIG. 9. In FIG. 9, arrangement of the chip pins 21 is seen from an upper side. For example, in FIG. 9, a pin in row A and column 1 (A1 pin) is used for VDD.

Herein, description will be made of an arrangement of the package pins 14 of the stacked semiconductor package 10. The package pins 14 are arranged in a pattern substantially identical to the predetermined pattern of the chip pins 21 of the semiconductor chip 11 (or 12). For example, the package pins of the stacked semiconductor package comprising the SDRAMs stacked on each other are arranged in a pattern shown in FIG. 10. In FIG. 10, those pins different from the pins in FIG. 9 are depicted by bold letters.

Referring to FIGS. 9 and 10, the pins are generally classified into data (DQ) pins and command/address (C/A) pins substantially arranged in an upper half portion and a lower half portion, respectively. In FIG. 10, six pins in three pairs depicted by the bold letters include chip selection pins (CS0 and CS1), clock pins (CKE0 and CKE1), and on-die termination pins (ODT0 and ODT1). These pins serve to operate the first and the second semiconductor chips 11 and 12 independently from each other. Each of these pins is connected to only one of the semiconductor chips. For example, if CS, CKE, and ODT of the first semiconductor chip 11 are connected to CO0, CKE0, and ODT0 of the package pins, respectively, CS, CKE, and ODT of the second semiconductor chip 12 are connected to CS1, CKE1, and ODT1, respectively.

Those package pins for operating the first and the second semiconductor chips 11 and 12 independently from each other are called option pins and the remaining package pins will be called regular pins.

The pin arrangement of the package pins of the stacked semiconductor package illustrated in FIG. 10 includes the option pins for the second (or additional) semiconductor chip in addition to the pin arrangement of the chip pins for each single semiconductor chip illustrated in FIG. 9.

On the other hand, the flexible substrate 13 is a multilayer wiring substrate which is, for example, a four-layer substrate comprising four conductive layers, namely, upper and lower (or front-side and rear-side) signal layers as two surface side layers and VDD and GND planes as two inner layers. Hereinafter, it is assumed that the flexible substrate 13 is the four-layer substrate.

Figure 11:
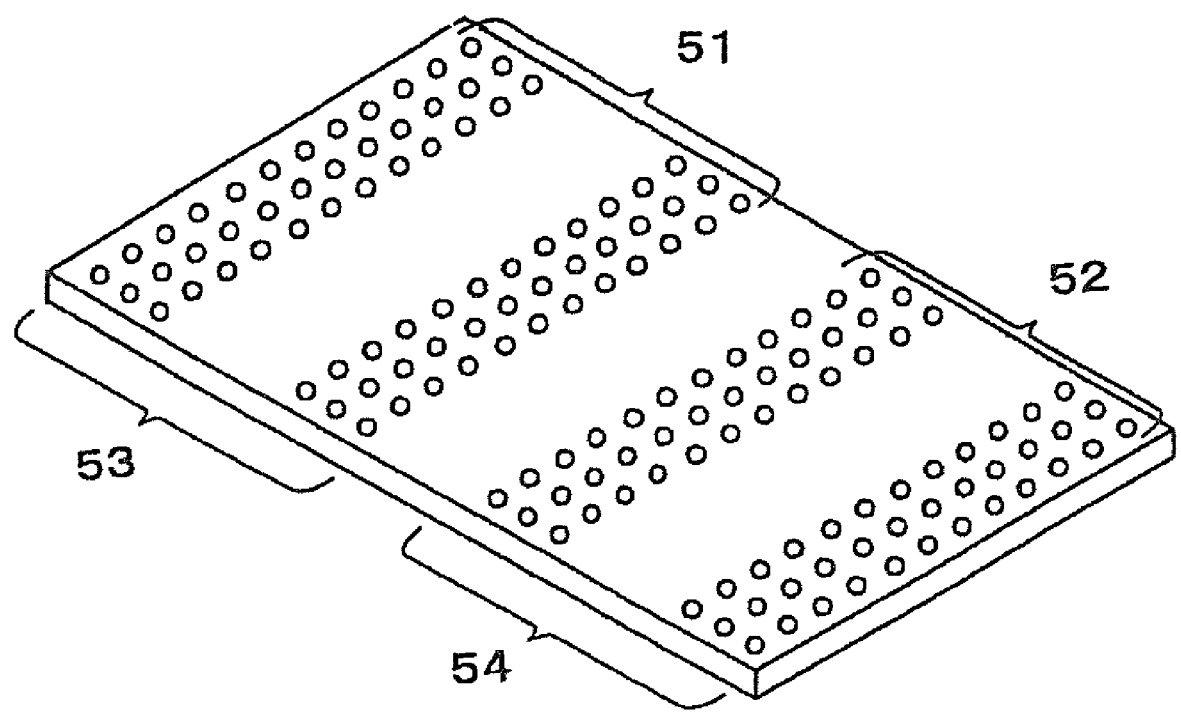
FIG. 11 is a perspective view of a flexible substrate used in the stackable semiconductor package illustrated in FIGS. 4A and 4B.

As shown in FIG. 11, the chip mounting area 51 on the top surface of the flexible substrate 13 is provided with a plurality of chip connection pads (first connection pad array) arranged in a pattern identical to the predetermined pattern of the pins 21 of the first semiconductor chip 11 so as to correspond to the pins 21 of the first semiconductor chip 11. In the remaining area 52 of the top surface of the flexible substrate 13, an external connection pad array including a plurality of external connection pads corresponding to the package pins (package pin array) 14 as the external connection terminals of the stacked semiconductor package 10 are formed in a mirror-image pattern with respect to the pin arrangement of the first semiconductor chip 11. On the bottom surface of the flexible substrate 13 and in an area 53 on a rear side of the chip mounting area 51, a plurality of chip connection pads (second connection pad array) (not shown) are arranged in a mirror-image pattern so as to correspond to the pins 21 of the second semiconductor chip 12. On the bottom surface of the flexible substrate 13 and in an area 54 corresponding to the external connection pad array, a plurality of vias (506 of FIG. 13) connected to the external connection pads are formed. The flexible substrate 13 further has a plurality of wires (wiring patterns for signal lines) and other vias (603,604,608,610,612 of FIG. 14, 702 of FIG. 15, 803 of FIG. 16) to connect the connection pads of the first and the second connection pad arrays to the external connection pads (package pins) corresponding thereto, respectively. The wires are formed in the front and the rear signal layers.

Figure 12A:
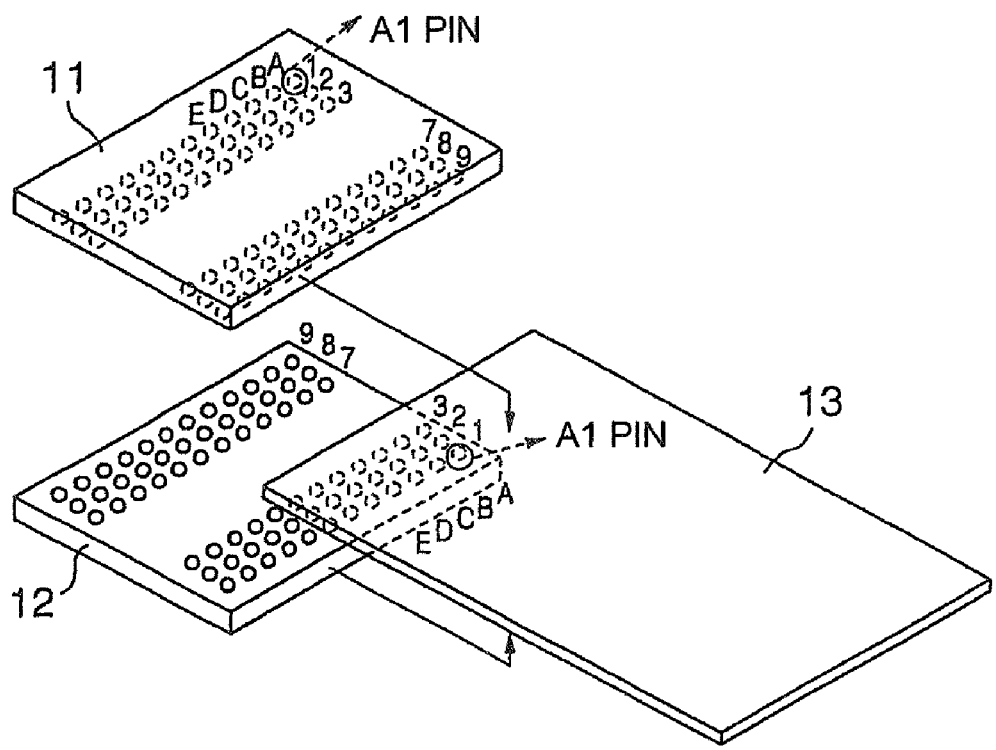
FIGS. 12A and 12B are a perspective view and a vertical sectional view showing the state before the semiconductor chips are mounted on the flexible substrate, respectively.
Figure 12B:
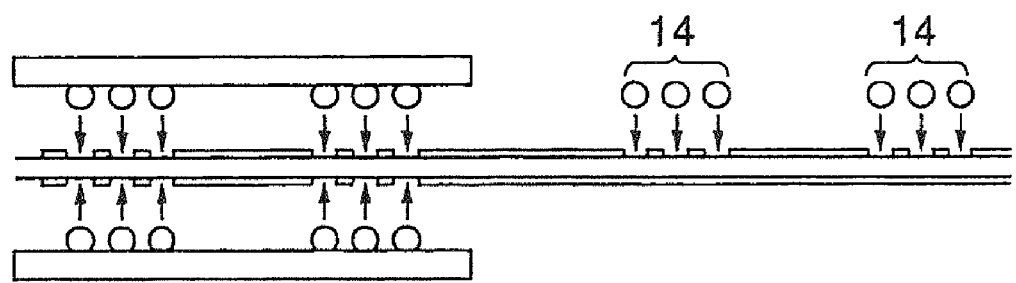

Referring to FIGS. 12A and 12B, the first and the second semiconductor chips 11 and 12 are mounted on the top and the bottom surfaces of the flexible substrate 13 in the chip mounting areas, respectively. At this time, the first and the second semiconductor chips 11 and 12 are reversed in position from each other as readily understood from FIG. 12A. In this state, the A1 pin of the first semiconductor chip 11 is positioned on a left side (left and back) while the A1 pin of the second semiconductor chip 12 is positioned on a right side (right and back).

Each pin of the first semiconductor chip 11 and the corresponding pin (having the same role) of the second semiconductor chip 12 in a reversed relationship to each other are connected through each of the wires of the flexible substrate 13 to a corresponding one of the package pins 14. However, in case of a pair of chip pins for independently operating the first and the second semiconductor chips 11 and 12, only one of the chip pins in pair is connected to a corresponding one of the package pins 14.

After the first and the second semiconductor chips 11 and 12 are mounted on the flexible substrate 13, the flexible substrate 13 is folded (folded into two) to wrap the second semiconductor chip 12. Then, the stacked semiconductor package 10 illustrated in FIGS. 4A and 4B is obtained. At this time, the package pins 14 are arranged in a same direction and in an identical pattern with respect to the pins 21 of the first semiconductor chip 11. Therefore, the stacked semiconductor package 10 can be directly mounted on a board adapted to mount the first semiconductor chip 11 as an elemental chip (as far as the board is adapted to accommodate the option pins). This means that the board having a mounting area required to mount the first semiconductor chip 11 is able to mount a memory package having a twice storage capacity.

Hereinafter, description will be made of connection between the connection pads connected to the first and the second semiconductor chips and the external connection pads.

The pins 21 of the first and the second semiconductor chips 11 and 12 include the chip pins connected to the option pins of the package pins 14 and the chip pins connected to the regular pins. The chip pins connected to the regular pins include those connected to the regular pins through the VDD plane or the GND plane and those connected to the regular pins through the front-side signal layer and/or the rear-side signal layer. The chip pins connected to the regular pins through the signal layer(s) include those pins which are connected in the manner such that each pair of pins faced to each other are directly connected through the one of the vias formed in the substrate. In order to realize the above-mentioned connection between the chips, the pads are connected in the following manner.

Figure 13:
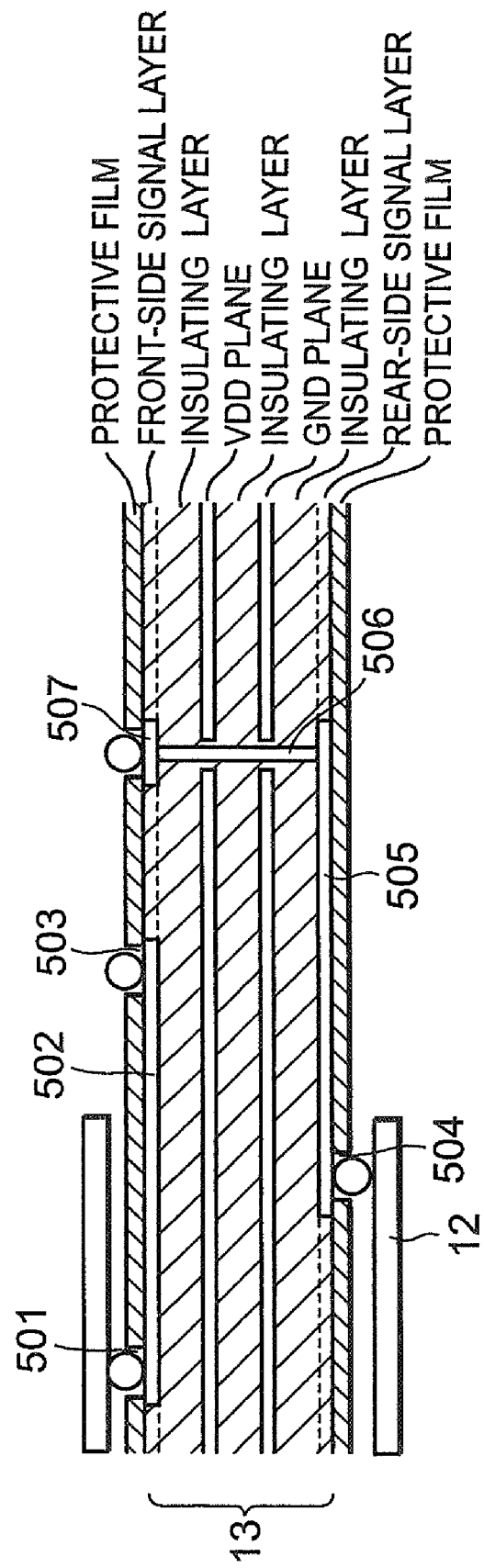
FIG. 13 is a sectional view for describing connection related to option pins on the flexible substrate of FIG. 11.

As shown in FIG. 13, in the first connection pad array, each pad 501 for the chip pin connected to the option pin is connected through the wire (signal line) 502 included in the front-side signal layer of the flexible substrate 13 to the external connection pad 503 for the corresponding option pin. On the other hand, in the second connection pad array, each pad 504 for the chip pin connected to the option pin is connected through the wire (signal line) 505 included in the rear-side signal layer of the flexible substrate 13 to the via 506 of the area 54 of the bottom surface of the flexible substrate 13. The via 506 is connected to the external connection pad 507 connected to the corresponding option pin. Herein, each wire included in the rear-side signal layer is connected through the via of the area 54 to the corresponding external connection pad.

Figure 14:
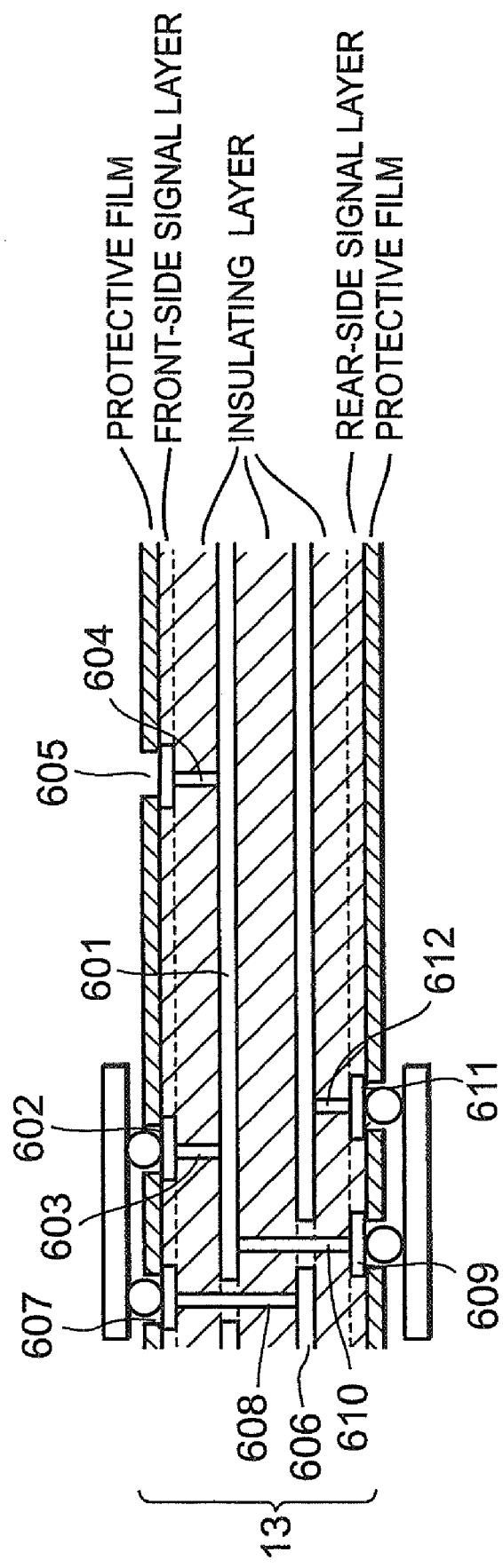
FIG. 14 is a sectional view for describing connection related to a VDD plane in the flexible substrate of FIG. 11.

As illustrated in FIG. 14, in the first connection pad array, the pads (VDD, VDDQ) 602 (only one shown) for the chip pins connected through the VDD plane 601 to the regular pins are connected to the VDD plane 601 through the vias 603 formed therefrom towards the bottom surface of the substrate 13. The VDD plane 601 is connected through the vias 604 to the corresponding external connection pads 605. Similarly, in the first connection pad array, the pads 607 (only one shown) for the chip pins connected through the GND plane 606 to the regular pins are connected to the GND plane 606 through the vias 608 formed therefrom towards the bottom surface of the substrate 13. On the other hand, in the second connection pad array, the pads 609 (only one shown) for the chip pins connected through the VDD plane 601 to the regular pins are connected to the VDD plane 601 through the vias 610 formed therefrom towards the top surface of the substrate 13. Similarly, in the second connection pad array, the pads (VSS, VSSQ) 611 (only one shown) for the chip pins connected through the GND plane 606 to the regular pins are connected to the GND plane 606 through the vias 612 formed therefrom towards the top surface of the substrate 13.

Herein, the pads (VDD, VDDQ) related to a power supply are connected to the single VDD plane. Alternatively, VDD and VDDQ may be separately wired by dividing the VDD plane in the same layer. Alternatively, VDD and VDDQ may be wired in empty space of the front-side signal layer and/or the rear-side signal layer. Furthermore, an additional plane may be formed for either of the pads for VDD and VDDQ. The pads (VSS, VSSQ) connected to the GND plane may be wired in the similar manner.

Figure 15:
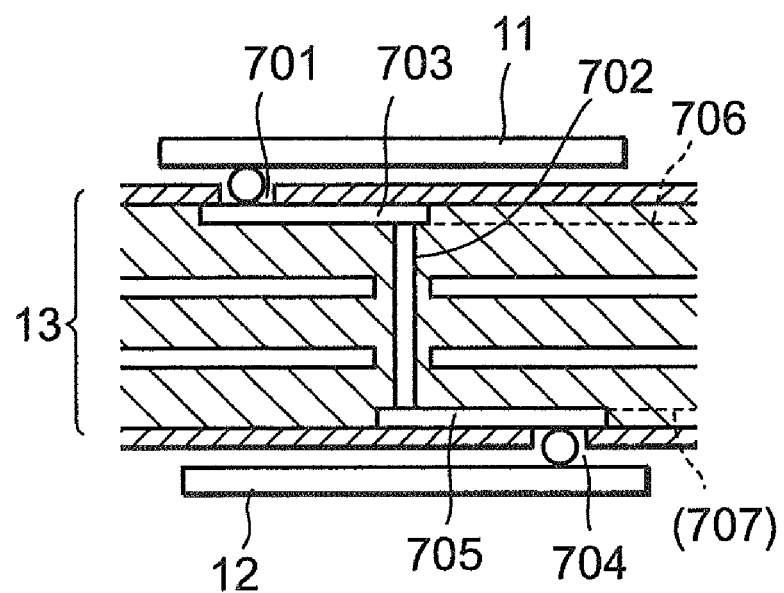
FIG. 15 is a sectional view for describing connection related normal regular pins on the flexible substrate of FIG. 11.

As illustrated in FIG. 15, in the first connection pad array, each pad 701 for the chip pin connected to the (normal) regular pin through the front-side signal layer and/or the rear-side signal layer (except those pads directly connected to the pads on the bottom surface through the vias, which will later be described) is connected through the wire (branch wire) 703 included in the front-side signal layer to the via 702 formed in the vicinity of an intermediate point of the corresponding pads of the first and the second signal pads. The corresponding pad 704 of the second connection pad array is connected to the same via 702 through the wire (branch wire) 705 included in the rear-side signal layer. Thus, a pair of the pads 701,704 for a pair of the chip pins connected to each (normal) regular pin through the wires of the signal layers are connected to each other through the via 702 formed in the vicinity of the intermediate point therebetween. The via 702 connected to the pair of the connection pads 701,704 is connected to the external connection pad for the corresponding regular pin through the wire (common wire) 706 or 707 of the front-side or the rear-side signal layer. The branch wires 703 and 705 and the via 702 connected therebetween are referred to as a branch wire portion all together. With the above-mentioned structure, the lengths of the branch wires connected to the pair of connection pads (chip pins) corresponding to each other are substantially equal to each other (to the extent that no problem is caused in practical use).

Figure 16:
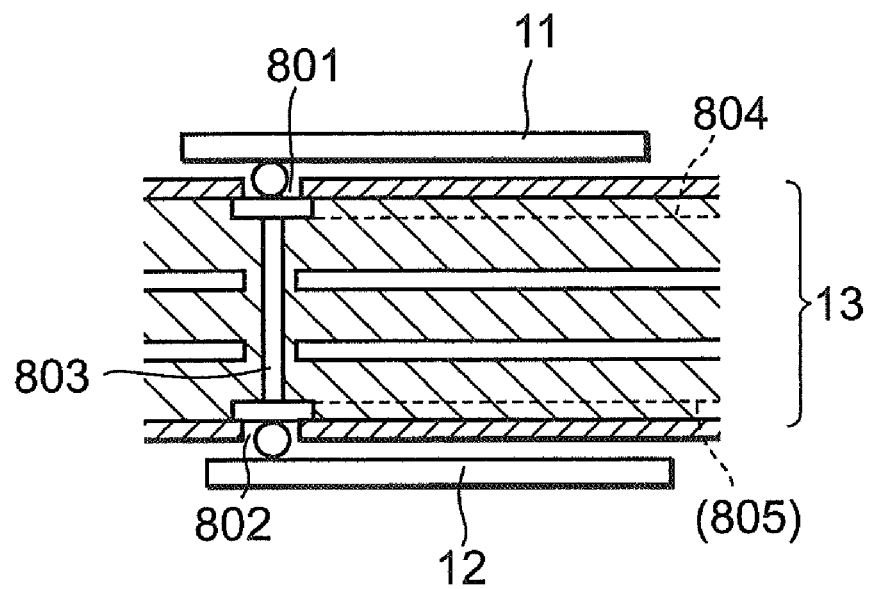
FIG. 16 is a sectional view for describing connection between pads directly connected to each other by a via in the flexible substrate of FIG. 11.

As shown in FIG. 16, in the first connection pad array, each remaining connection pad 801 connected to the regular pins through the front-side signal layer and/or the rear-side signal layer is connected through the via 803 to the connection pad 802 of the second connection pad array which is positioned on the rear side. This is because some of the pins of each semiconductor chip 11, 12 may be exchanged in their roles without causing any problem. For example, in case where the pins of each semiconductor chip 11, 12 are assigned with the roles as illustrated in FIG. 9, DQ0, DQ1, DQ2, and DQ3 pins of one of the first and the second semiconductor chips 11, 12 are faced to DQ1, DQ0, DQ3, and DQ2 pins of the other semiconductor chip. Herein, DQ0, DQ1, DQ2, and DQ3 pins of each of the semiconductor chips may be exchanged in their roles so that a pair of those pins faced to each other may be connected to the same regular pin without causing any problem. Each of the connection pads (801) of the first connection pad array connected to those pins is directly connected through the via 803 to each of the connection pads (802) of the second connection pad array which is located on the bottom side of the rear side. One of the pair of the connection pads 801, 802 connected to each other through the via 803 is connected to the corresponding regular pin through the wire 804 or 805 of the front-side or the rear-side signal layer. In this case, the via 803 forms a branch wire portion while the wire 804 or 805 is a common wire connected to the branch wire portion.

The corresponding connection pads which can be connected directly through the via may be connected to each other in a different manner, taking into account the convenience in design or production. Specifically, two connection pads corresponding to each other may be connected by a via formed in the vicinity of an intermediate point therebetween in the manner similar to that mentioned above. Alternatively, the pins located on the front and the rear sides are not directly connected but are connected through a via formed at a separate position by the use of wires. In case where the pads are directly connected through the via, the via is formed on the pads to directly connect the pads. Alternatively, the via may be formed in the vicinity of the pads to directly connect the pads as will readily be understood.

Next, description will be made of connection between the first and the second connection pad arrays and the external connection pads, in particular, connection related to the connection pads for the chip pins connected to the regular pins.

Figure 17A:
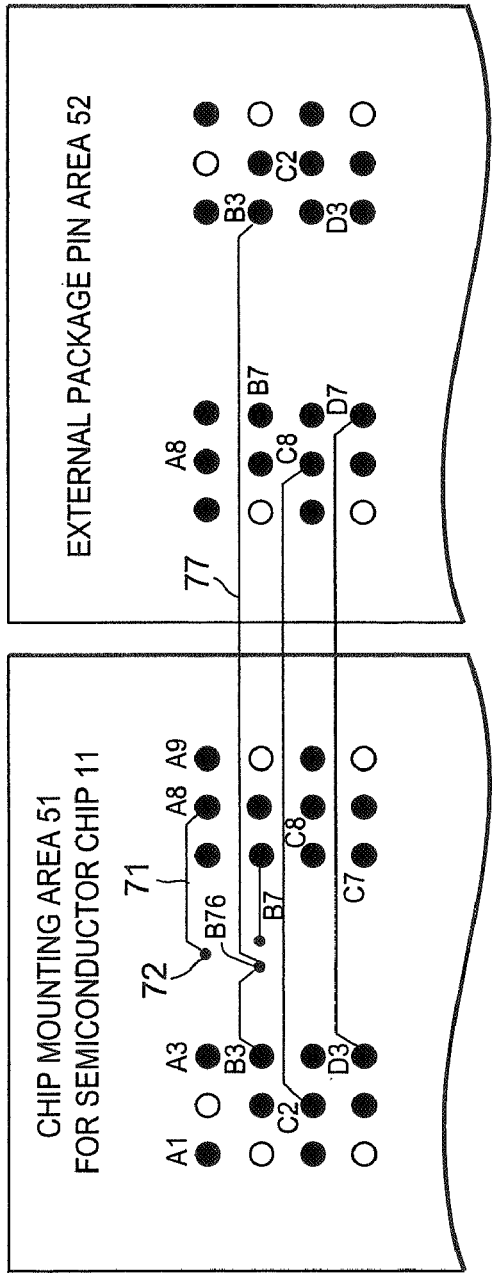
FIGS. 17A and 17B show, as a part of wiring of the flexible substrate, connection between a first chip connection pad array and an external connection pad array and connection between a second chip connection pad array and vias connected to the external connection pad array, respectively.
Figure 17B:
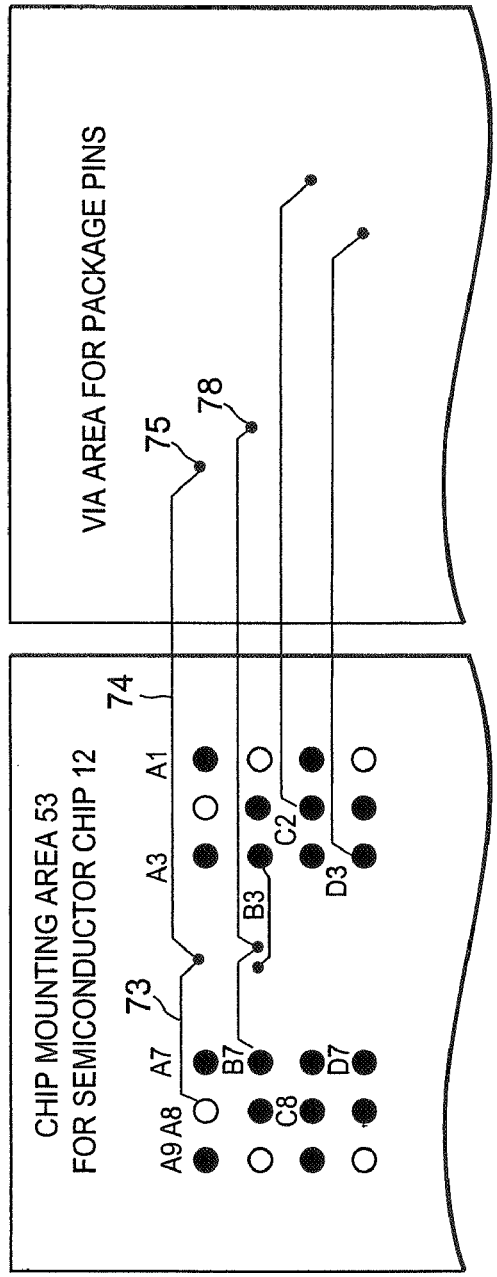

Referring to FIG. 17A, a part of the front-side signal layer of the flexible substrate 13 is shown (corresponding to the lines A to D of the semiconductor chip in FIG. 9). A part of the rear-side signal layer of the flexible substrate 13 corresponding to FIG. 17A is shown in FIG. 17B. In both of FIGS. 17A and 17B, the flexible substrate 13 is seen from the top surface.

Referring to FIG. 17A, the connection pad for the A8 pin of the first semiconductor chip is connected through a front-side wire (branch wire) 71 to a via 72. On the other hand, as illustrated in FIG. 17B, the connection pad for the A8 pin of the second semiconductor chip is connected through a rear-side wire (branch wire) 73 to the via 72. Herein, the via 72 is formed in the vicinity of an intermediate point between the connection pad for the A8 pin of the first semiconductor chip and the connection pad for the A8 pin of the second semiconductor chip so that the lengths of the wires 71 and 73 are equal to each other. The wires 71 and 73 are formed so as to be substantially equal in length to each other and to serve as transmission lines (to be matched in impedance). The via 72 is further connected through a wire (common wire) 74 of the rear-side signal layer to a via 75 formed on the area 54 of the bottom surface and connected to the pad for the A8 package pin.

Like the connection pads for the A8 pins, the connection pads for the B3 pins of the first and the second semiconductor chips are connected to each other through a via 76 formed in the vicinity of an intermediate point therebetween. Unlike the via 72 for the A8 pins, the via 76 is connected through a signal line 77 of the front-side signal layer to the pad for the B3 package pin.

Like the connection pads for the A8 pins, the connection pads corresponding to the B7 pins of the first and the second semiconductor chips are connected to a via 78 on the rear side of the pad for the B7 package pin.

As shown in FIG. 17A, the connection pads for the C2 pin and the D3 pin of the first semiconductor chip are connected through the wires of the front-side signal layer to the external connection pads for the C8 package pin and the D7 package pin, respectively. Although not illustrated in the figure, these connection pads for the C2 and the D3 pins are directly connected through the vias to the connection pads for the C8 pin and the D7 pin of the second semiconductor chip on the rear side, respectively.

On the other hand, as shown in FIG. 17B, the connection pads for the C2 pin and the D3 pin of the second semiconductor chip are connected through the wires of the rear-side signal layer to the vias connected to the C2 package pin and the D3 package pin, respectively. Although not illustrated in the figure, these connection pads for the C2 and the D3 pins are connected through the vias to the connection pads for the C8 pin and the D7 pin of the first semiconductor chip on the front side, respectively.

The pads connected to the VDD plate, such as the connection pads for the A1 pins, are directly connected by the vias to the VDD plane. This also applies to the pads connected to the GND plane.

The connection pads for the chip pins connected to the option pins are connected through the wires of the front-side or the rear-side signal layer, in the manner similar to the connection pad for the C2 pin or the D3 pin of the first or the second semiconductor chip.

Next, the wires formed on the flexible substrate will be described. The flexible substrate 13 is a multiplayer substrate having a ground wire and/or a power supply wire. Most (preferably all) of signal wiring patterns form transmission lines together with the ground plane and/or the power supply plane (or wire). Referring to FIGS. 18 to 21, various structures of the transmission line formed by each signal wiring pattern will be described.

Figure 18A:
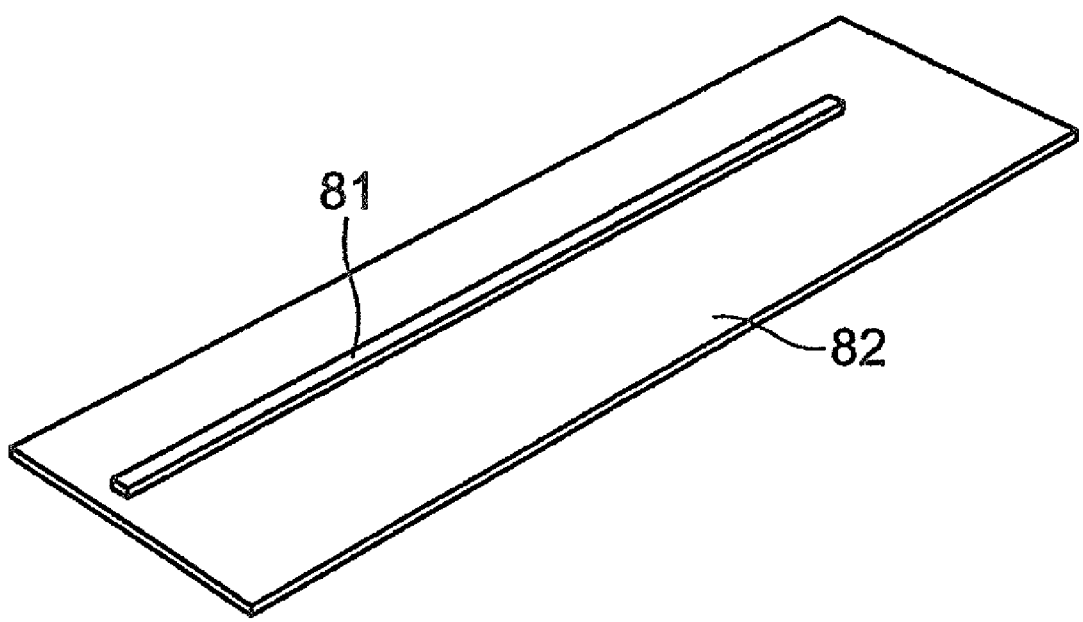
FIGS. 18A and 18B are a perspective view and a vertical sectional view for describing a transmission line formed as a microstrip line, respectively.
Figure 18B:
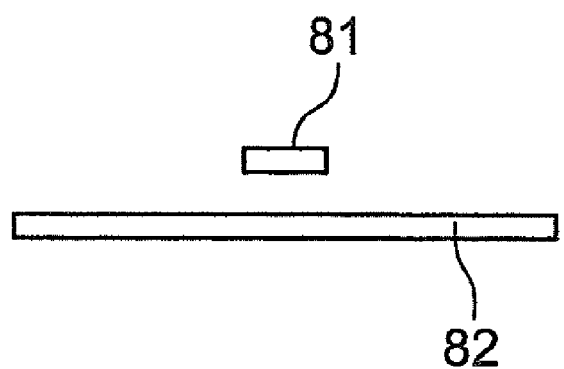
Figure 19A:
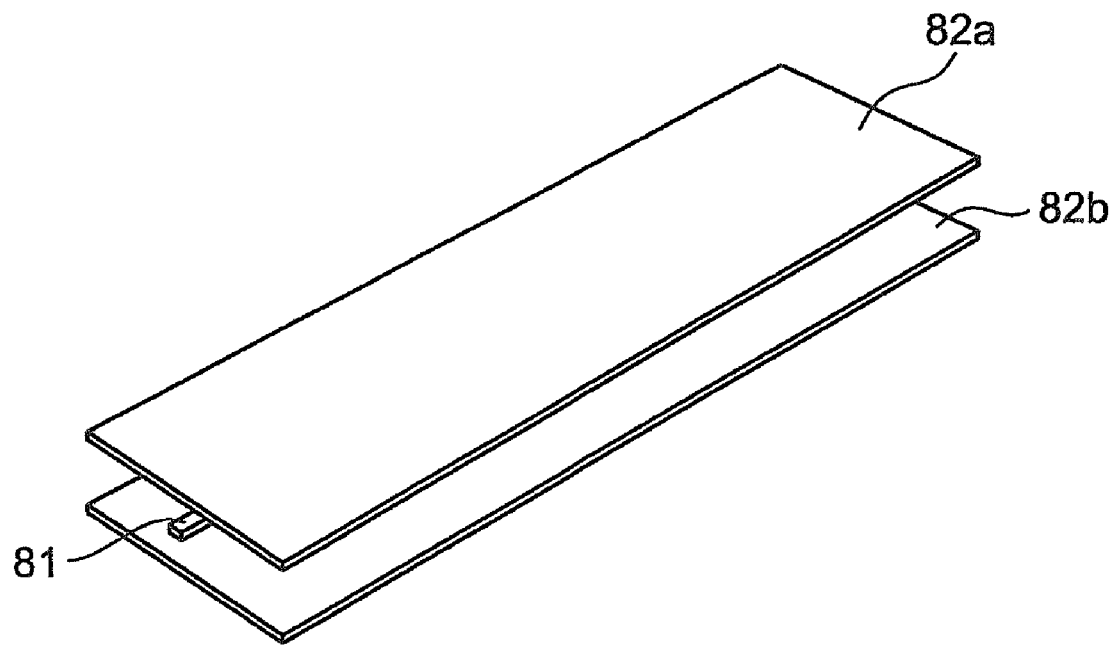
FIGS. 19A and 19B are a perspective view and a vertical sectional view for describing another transmission line formed as a strip line, respectively.
Figure 19B:
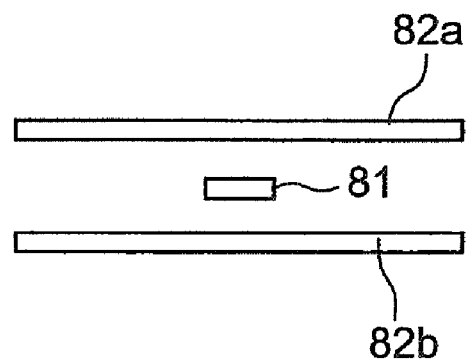
Figure 20A:
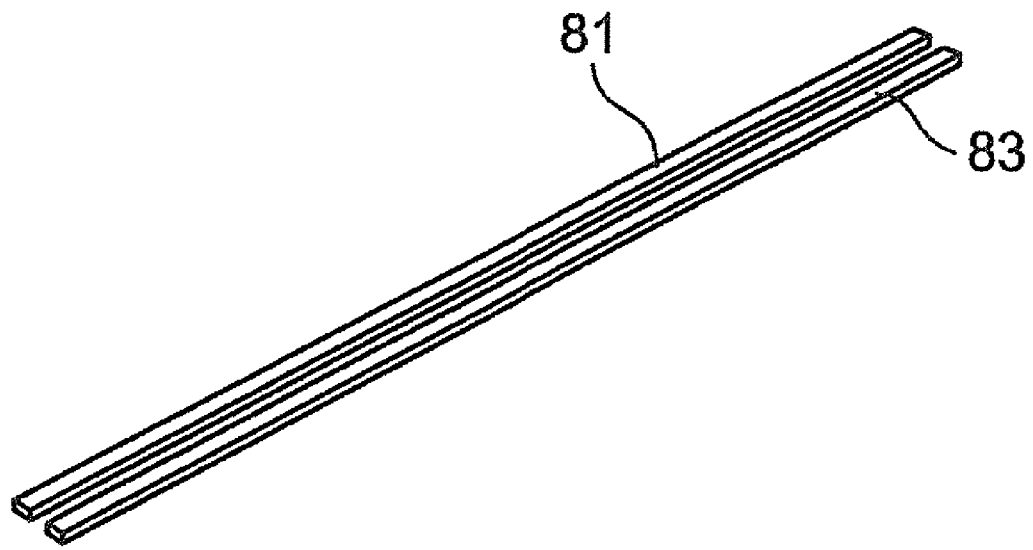
FIGS. 20A and 20B are a perspective view and a vertical sectional view for describing still another transmission line formed as a parallel line, respectively.
Figure 20B:
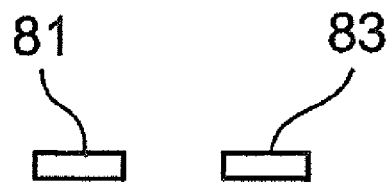

As illustrated in FIGS. 18A and 18B, the transmission line may be a microstrip line comprising a signal wiring pattern 81 and a ground plane and/or a power supply plane (flat wiring) 82 adjacent to the signal wiring pattern 81. Alternatively, as illustrated in FIGS. 19A and 19B, the transmission line may be a strip line comprising a signal wiring pattern 81 and a pair of ground plane and/or a power supply plane (flat wiring) 82a and/or 82b adjacent to the signal wiring pattern 81 on opposite sides. As illustrated in FIGS. 20A and 20B, the transmission line may be a parallel line comprising a signal wiring pattern 81 and a ground wire and/or a power supply wire 83 flush with the signal wiring pattern 81 and extending parallel to the signal wiring pattern 81 on one side (or opposite sides) thereof. The structure of the above-mentioned transmission lines are properly selected and combined to form the signal wiring patterns.

The ground plane and/or the power supply plane (flat wiring) 82, 82a and 82b forming the microstrip line or the strip line has a width not smaller than that of the signal wiring pattern.

Figure 21A:
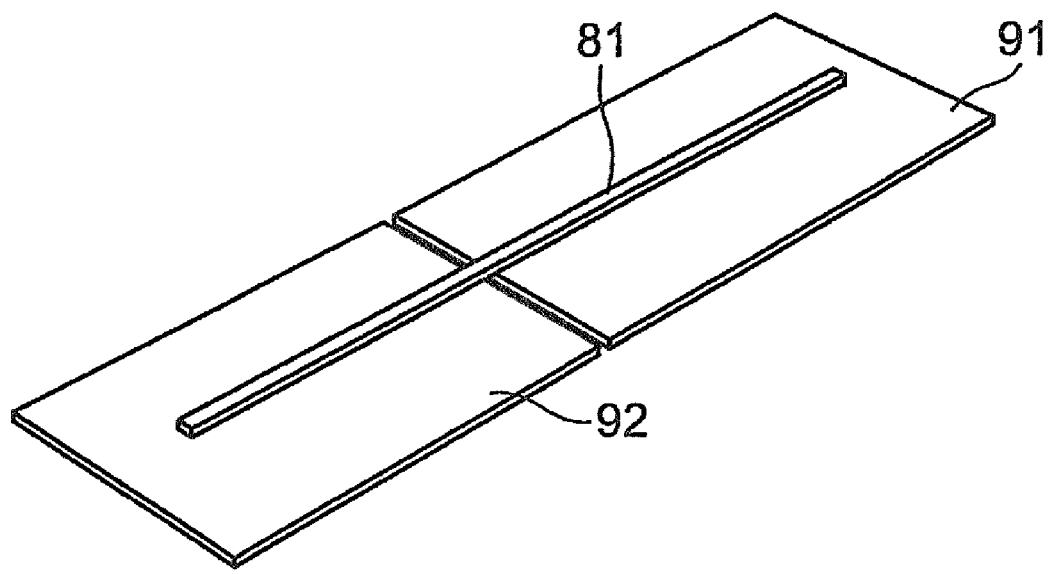
FIG. 21A is a perspective view showing a ground plate or a power supplying plate comprising a plurality of ground/power supplying plate portions.

Referring to FIG. 21A, the ground plane and/or the power supply plane (flat wiring) forming the transmission line may comprise a plurality of ground plane parts and/or power supply wiring plane parts (plates 91 and 92).

Figure 21B:
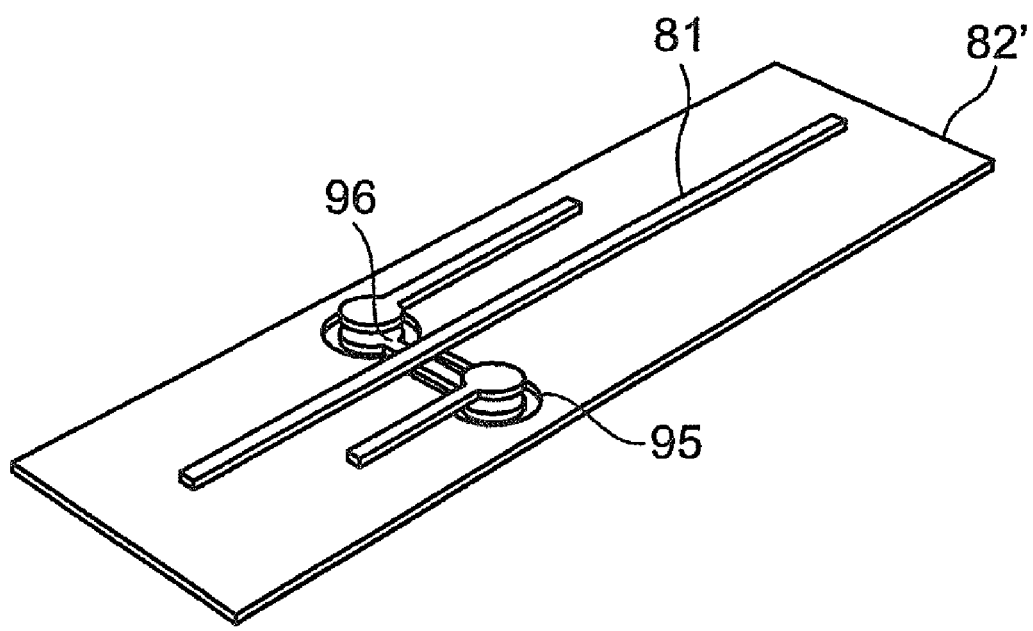
FIG. 21B is a perspective view showing another ground plate of another power supplying plate which is partly divided by a via and/or another wire.

Referring to FIG. 21B, the ground plane and/or the power supply plane 82', 82a, 82b forming the transmission line may be partially separated by a via 95 and/or another wire 96.

Although this invention has been described in conjunction with one embodiment thereof, this invention is not limited to the foregoing embodiment.

Figure 22:
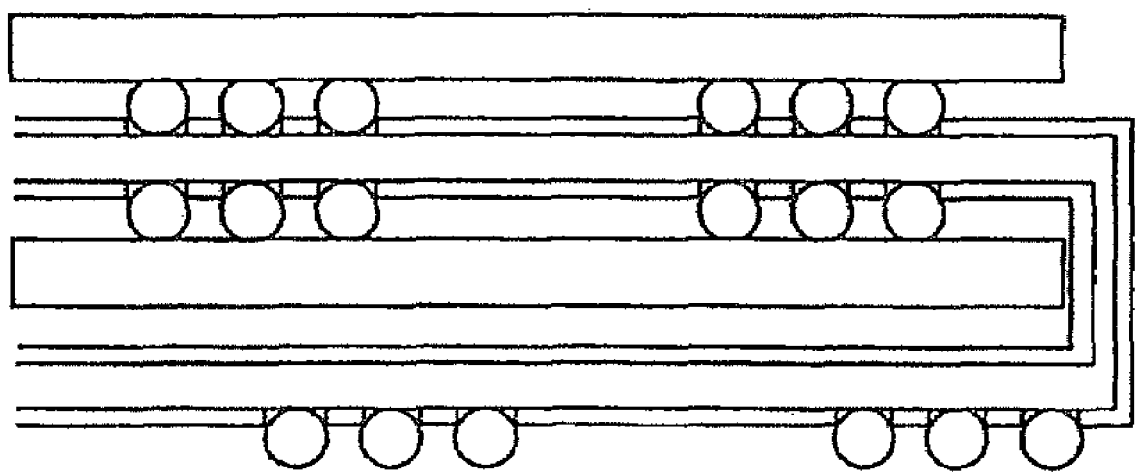
FIG. 22 is a schematic sectional view of a modification of the stacked semiconductor package according to this invention.
Figure 23A:
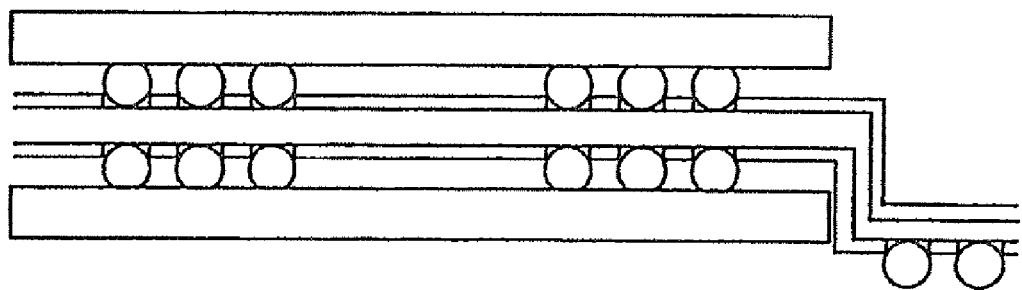
FIGS. 23A and 23B are a schematic sectional view and a perspective view of another modification of the stacked semiconductor package according to this invention, respectively.
Figure 23B:
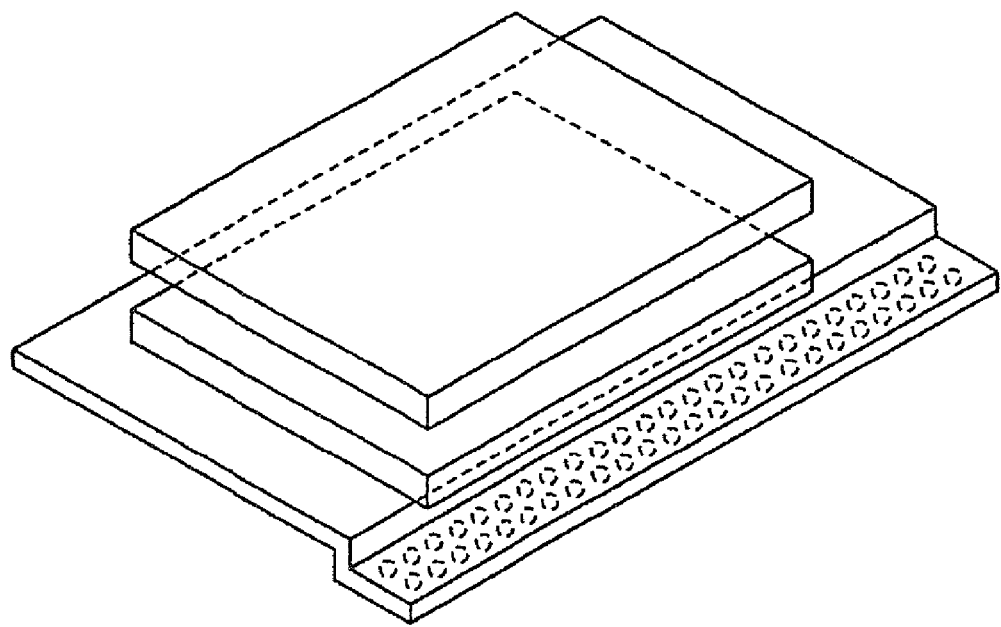

For example, in the foregoing description, the package pins are aligned with the chip pins of the first semiconductor chip in the vertical direction. Alternatively, as shown in FIG. 22, the package pins may be shifted in position in order to reduce the length of the common wires. As shown in FIGS. 23A and 23B, the arrangement of the package pins may be quite different from that of the chip pins of the first semiconductor chip.

What is claimed is:

1. A stacked semiconductor package comprising two semiconductor chips each of which has a mounting surface provided with a plurality of chip pins arranged in a predetermined pattern, and a substrate having upper and lower surfaces on which the two semiconductor chips are mounted so that the mounting surfaces are faced to each other with the substrate interposed therebetween,
wherein the substrate has a plurality of package pins corresponding to the chip pins, respectively, said plurality of package pins being formed in an area which is different from a chip mounting area where either of the semiconductor chips is mounted and which becomes another lower surface when the substrate is folded in two to wrap the semiconductor chip mounted on the lower surface,
wherein at least one of the package pins is an option pin connected to a corresponding chip pin of either one of the semiconductor chips and at least one of the package pins is a regular pin connected to a corresponding chip pin of each of the semiconductor chips,
wherein the substrate has a common wire having one end connected to the regular pin and a branch wire portion connecting the other end of the common wire to two chip pins as the corresponding chip pins of the semiconductor chips; and
wherein the branch wire portion includes a front layer side signal layer and a back layer side signal layer which are connected to the corresponding chip pins at points where wiring length from the one end of the common wire to one of the corresponding chip pins is substantially equal to that from the one end of the common wire to the other end of the corresponding chip pins.

2. A stacked semiconductor package according to claim 1, wherein:
the branch wire portion comprises a via formed in the vicinity of an intermediate position between the corresponding chip pins and connected to the other end of the common wire, and the front layer side signal layer and the back layer side signal layer which are substantially equal to each other in length and which connect the via to the corresponding chip pins.

3. A stacked semiconductor package according to claim 1, wherein the substrate is a multilayer substrate having a ground plane and/or a power supply plane, the common wire and the branch wire portion each forming a transmission line together with the ground plane and/or the power supply plane.

4. A stacked semiconductor package according to claim 3, wherein the transmission line comprises any one of a microstrip line, a strip line, and a parallel line.

5. A stacked semiconductor package according to claim 3, wherein the ground plane and/or the power supply plane includes a portion formed by a plurality of ground plane parts and/or power supply plane parts or a portion partially separated by a via or another wire.

6. A stacked semiconductor package according to claim 1, wherein each of the semiconductor chips is an elemental chip (bare die), a chip having a packaged structure obtained by mounting the elemental chip on a substrate, electrically connecting wires (pads) of the elemental chip and wires on the substrate by wire bonding, inner lead bonding, flip-chip connection, or the like, and encapsulating the chip and the substrate in a resin mold in order to protect a conductive pattern on the substrate, or a wafer level CSP or wafer process package.

7. A stacked semiconductor package according to claim 1, wherein the arrangement of the package pins is based on the predetermined pattern.

8. A stacked semiconductor package according to claim 7, wherein the package pins comprise pins arranged according to the predetermined pattern and additional pins.

9. A stacked semiconductor package according to claim 1, wherein the chip pins of one of the semiconductor chips are arranged on the substrate so as to be a mirror-image of the chip pins of the other of the semiconductor chips.

10. A stacked semiconductor package according to claim 1, wherein the two semiconductor chips are aligned with one another.

11. A stacked semiconductor package according to claim 1, wherein the chip pins of one of the semiconductor chips and the chip pins of the other of the semiconductor chips are aligned with one another.

12. A stacked semiconductor package according to claim 1, wherein the package pins are arranged in a pattern identical to the predetermined pattern.

13. A stacked semiconductor package according to claim 1, wherein the chip pins corresponding to the regular pin are in different relative locations on the semiconductor chips.

* * * * *